(12) United States Patent
Weinert et al.

(10) Patent No.: US 6,445,557 B1
(45) Date of Patent: Sep. 3, 2002

(54) METHOD AND APPARATUS FOR PERFORMING A SHORT-CIRCUIT AND OVERLOAD DISCONNECTION WITH A SEMICONDUCTOR COMPONENT

(75) Inventors: Ulrich Weinert, Herzogenaurach; Gerd Griepentrog, Erlangen, both of (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/607,319

(22) Filed: Jun. 30, 2000

Related U.S. Application Data (63) Continuation of application No. PCT/DE98/03768, filed on Dec. 22, 1998.

(30) Foreign Application Priority Data

Dec. 30, 1997 (DE) ......................................... 197 58 233

(51) Int. Cl.$^7$ ................................................ H02H 7/00
(52) U.S. Cl. ........................ 361/93.2; 361/58; 361/101
(58) Field of Search ............................... 361/93.1, 115, 361/101, 18, 58, 152, 93.2

(56) References Cited

U.S. PATENT DOCUMENTS

| | | | |
|---|---|---|---|
| 4,228,367 A | 10/1980 | Brown | 307/251 |
| 5,264,713 A | * 11/1993 | Palmour | 257/77 |
| 5,303,114 A | 4/1994 | Ferry et al. | 361/101 |
| 5,390,070 A | 2/1995 | Niedermeier | 361/152 |
| 5,808,327 A | 9/1998 | Maier et al. | 257/161 |
| 6,034,385 A | 3/2000 | Stephani et al. | 257/263 |
| 6,067,219 A | * 5/2000 | Armstrong et al. | 361/101 |

FOREIGN PATENT DOCUMENTS

| | | | |
|---|---|---|---|
| DE | 44 45 079 A1 | 6/1996 | H02H/3/08 |
| DE | 196 12 216 A1 | 10/1997 | H02H/3/08 |

OTHER PUBLICATIONS

Published International Application No. WO 88/08228 (O'Shaughnessy et al.), dated Oct. 20, 1988.

* cited by examiner

*Primary Examiner*—Stephen W. Jackson
(74) *Attorney, Agent, or Firm*—Laurence A. Greenberg; Werner H. Stemer; Ralph E. Locher (57) ABSTRACT

A method for performing a short-circuit and overload disconnection with a semiconductor component includes the steps of providing a semiconductor component having a drain, a source and a gate. The semiconductor component has a gate-source voltage applied thereto, a current flowing therethrough, and a voltage dropping between the source and the drain. The gate-source voltage at the semiconductor component is adjusted, in dependence of the current flowing through the semiconductor component, such that, after charge carriers in the semiconductor component are depleted, the voltage dropping between the source and the drain assumes a highest possible value still uncritical for the semiconductor component and for a circuit to be disconnected. An algorithm is used for the step of adjusting the voltage dropping between the source and the drain. The apparatus for carrying out the method uses of a processor for ascertaining and processing measured values and for performing the short-circuit recognition and the disconnection.

17 Claims, 6 Drawing Sheets

METHOD AND APPARATUS FOR PERFORMING A SHORT-CIRCUIT AND OVERLOAD DISCONNECTION WITH A SEMICONDUCTOR COMPONENT

CROSS-REFERENCE TO RELATED APPLICATION

This application is a continuation of copending International Application No. PCT/DE98/03768, filed Dec. 22, 1998, which designated the United States.

BACKGROUND OF THE INVENTION

FIELD OF THE INVENTION

The invention relates to a method for performing a short-circuit and overload disconnection using a semiconductor component. The invention relates in particular to a method for performing a disconnection using active limiters in the form of JFETs (Junction Field Effect Transistors) based on silicon carbide (SiC). The semiconductor component has a drain, a source and a gate and a prescribed gate-source voltage is applied to it. The semiconductor has a prescribed current flow, and as a result, a voltage drops across the component. In addition, the invention also relates to an apparatus for carrying out the method.

The actual short-circuit as well as the overload operating situation are both referred to by the term "short-circuit" below. In such operating situations, the aim is to turn off the current in the electrical power supply as quickly as possible.

During a short-circuit, unavoidable thermal and electrodynamic stresses in electrical or electronic components, which are used for the process of turning off or disconnecting, are linked to the short-circuit's recognition time and to the time required for the disconnection process. Semiconductor components specifically based on SiC are currently being developed whose properties—such as low current flow losses, overload capacity, high reverse voltage—will in the future permit a short-circuit disconnection which limits the current and is virtually instantaneous even in a practical operations. This is associated with a drastic reduction in the forward current and the resistive heating integral. If, by using comparative simulation calculations, it were possible to find suitable descriptive equations for the SiC-based semiconductor components, then these equations could be used as a basis to derive methods ensuring a short-circuit disconnection which poses no risk to the semiconductor components or to the power supply.

European Patent No. EP 0 717 887 B1, which corresponds to U.S. Pat. No. 5,808,327, discloses an AC power controller which makes use of two serially reverse-connected semiconductor components on silicon carbide (SiC). In addition, German Published, Non-Prosecuted Patent Application DE 195 48 443 A1, which corresponds to U.S. Pat. No. 6,034,385, describes a semiconductor configuration for limiting a current based on SiC technology. U.S. Pat. No. 6,034,385 essentially describes the structure of a component having individual semiconductor regions. Furthermore, U.S. Pat. No. 4,228,367 discloses a high-speed circuit for analog signals with semiconductor components, in which the components used are JFETs, the circuit having assigned thereto fault monitoring devices which use the current-limiting effect of the JFETs, which act as limiters. The components are conventional field-effect transistors based on silicon (Si).

SUMMARY OF THE INVENTION

It is accordingly an object of the invention to provide a method and an apparatus for a short-circuit and overload disconnection which overcome the above-mentioned disadvantages of the heretofore-known methods and devices of this general type and which use semiconductor components based on SiC technology and allow current-carrying lines to be disconnected as quickly as possible.

With the foregoing and other objects in view there is provided, in accordance with the invention, a method for performing a short-circuit and overload disconnection with a semiconductor component, which includes the steps of:

providing a semiconductor component having a drain, a source and a gate, the semiconductor component having a gate-source voltage $U_{GS}$ applied thereto, having a current $I_{JFET}$ flowing therethrough, and having a voltage $U_{JFET}$ dropping across the semiconductor component;

adjusting, in an operating situation, the gate-source voltage $U_{GS}$ at the semiconductor component, in dependence of the current $I_{JFET}$, such that, after charge carriers in the semiconductor component are depleted, the voltage $U_{JFET}$ assumes a highest possible value still uncritical for the semiconductor component and for a circuit to be disconnected; and using, for the step of adjusting the gate-source voltage $U_{GS}$, an algorithm in the form of $$U_{GS} = U_{on}\left[1 - \sqrt{\frac{I_{JFET}(t)}{G_{JFET}(U_{JFET})}}\right]$$

where $U_{on}$ denotes a switching voltage, $I_{JFET}(t)$ denotes the current $I_{JFET}$ in dependence of a time t and $G_{JFET}$ denotes a function dependent only on the voltage $U_{JFET}$ dropping across the semiconductor component.

In accordance with another mode of the invention, an active limiter in the form of a JFET based on silicon carbide is used as the semiconductor component.

In accordance with yet another mode of the invention, the current $I_{JFET}$ is used for at least one of an open-loop control and a closed-loop control of the semiconductor component.

In accordance with a further mode of the invention, the voltage $U_{JFET}$ is recorded as an actual value at the semiconductor component. The actual value is used for determining a closed-loop control signal, and, with the closed-loop control signal, a parameter drift of the semiconductor component is compensated.

In accordance with another mode of the invention, open-loop control signals and closed-loop control signals are determined from at least one of the current $I_{JFET}$ and the voltage $U_{JFET}$. The open-loop control signals and the closed-loop control signals are superimposed for controlling the semiconductor component.

With the objects of the invention in view there is also provided, in combination with a short-circuit and overload circuitry and a semiconductor component connected to the short-circuit and overload circuitry, the semiconductor component having a drain, a source and a gate, the semiconductor component having a gate-source voltage $U_{GS}$ applied thereto, a current $I_{JFET}$ flowing therethrough, and a voltage $U_{JFET}$ dropping between the drain and the source, an apparatus for performing a short-circuit and overload disconnection, including:

a processor operatively connected to the semiconductor component for processing measured values and for early recognizing one of a short-circuit and an overload;

the processor being programmed to:

adjust, in an operating situation, the gate-source voltage $U_{GS}$ at the semiconductor component, in dependence of the current $I_{JFET}$, such that, after a charge carrier depletion in the semiconductor component, the voltage $U_{JFET}$ assumes a highest possible value still uncritical for the semiconductor component and for the short-circuit and overload circuitry to be disconnected;

use an algorithm in the form of $$U_{GS} = U_{on}\left[1 - \sqrt{\frac{I_{JFET}(t)}{G_{JFET}(U_{JFET})}}\right]$$

for adjusting the gate-source voltage $U_{GS}$, where $U_{on}$ denotes a switching voltage, $I_{JFET}(t)$ denotes the current $I_{JFET}$ in dependence of a time t and $G_{JFET}$ denotes a function dependent only on the voltage $U_{JFET}$ dropping between the drain and the source; and drive the semiconductor component as an active limiter for supervising the short-circuit and overload circuitry.

In other words, the apparatus according to the invention is configured for carrying out the method of the invention. The apparatus has a processor for processing measured values, and the processor is configured for an early recognition of the short-circuit or of the overload and drives or corrects a semiconductor component as an active limiter for monitoring a short-circuit and overload circuitry.

In accordance with another feature of the invention, the processor is configured to carry out a regulating function, in particular a PI regulating function.

In accordance with another feature of the invention, the processor is configured to carry out an open-loop control function and/or a closed-loop control function based on the algorithm for driving or controlling the semiconductor component.

In accordance with a further feature of the invention, the processor includes a first unit for producing a regulating signal and a second unit for producing a reference variable with the algorithm; and the processor forms a summation signal from the regulating signal and the reference variable for driving the semiconductor component as an active limiter.

Other features which are considered as characteristic for the invention are set forth in the appended claims.

Although the invention is illustrated and described herein as embodied in a method and an apparatus for performing a short-circuit and overload disconnection it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

The figures are in part described jointly. Identical or corresponding units or elements have identical or equivalent reference symbols in the figures. In the context of defining algorithms for an early short-circuit recognition or detection, electrical semiconductor components are regarded as active limiters, because the current-limiting effect is intended to start at current levels which are actually a long way below the saturation threshold $I_{sat}$. Such semiconductor components form so-called JFETs (junction field-effect transistor). The operation of such JFETs is described by the JFET current $I_{JFET}$ for a gate-source voltage $U_{GS}$ impressed on the component, which results in an associated voltage drop $U_{JFET}$. The JFETs defined in this manner should be capable of being used as active limiters for disconnecting or turning off current-carrying lines and for a short-circuit disconnection in power supplies or power systems. An associated circuit diagram for a short-circuit circuitry 20 and a JFET 1 is described with reference to FIG. 4.

Figure 4:
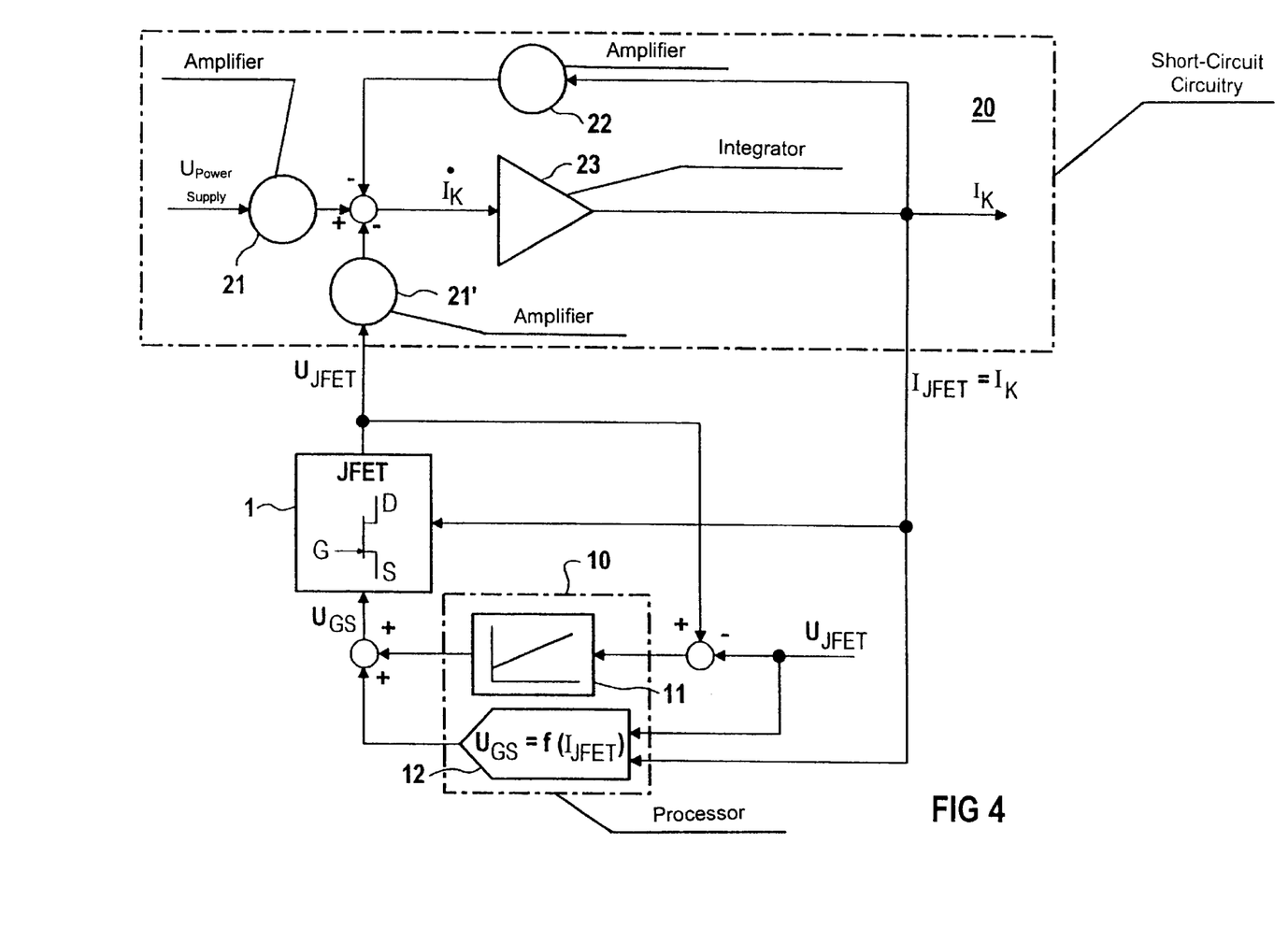
FIG. 4 is a schematic diagram of a configuration illustrating a signal flow for a JFET controller in the case of a short-circuit disconnection according to the invention.

When the short-circuit has been recognized or detected, the JFET 1 is controlled by varying the gate-source voltage $U_{GS}$. In an isothermal operating situation, the initially uncontrolled JFET 1 with $U_{Gs}=0$ V has the following characteristic curve:

$$I_d = I_{sat} \cdot \left(\frac{U_{JFET}^\beta}{U_{sat}^\beta + U_{JFET}^\beta}\right)^{\frac{1}{\beta}} \quad (1)$$

where $I_d$=Forward current (conducting state current)

$I_{sat}$=Saturation current $U_{sat}$=Saturation voltage ($U_{sat}=R_{ON}*I_{sat}$)

$R_{ON}$=Resistance of the JFET at the operating point $U_{JFET}$=Voltage across the JFET (=$U_{DS}$)

β=Saturation exponent

In this case, the saturation current $I_{sat}$ is approximately in the range of 10 to 16 times the rated current. At higher voltages (U>$U_{ion}$), additional bipolar effects arise which can be described by the following ionization term:

$$I_{ion} = \qquad (2)$$

$$I_{sat1} \cdot \sqrt{\frac{U_{JFET} - U_{ion}}{X_m \cdot U_{th}}} \cdot \exp\left(\sqrt{\frac{U_{JFET} - U_{ion}}{X_m \cdot U_{th}}}\right) \text{ for } U_{JEFT} > U_{ion}$$

(otherwise = 0)

where $I_{ion}$=Ionization current $I_{sat1}$=Ionization saturation current $U_{th}$=Thermal voltage ($U_{th}=k_B*T/q_e$)

$U_{ion}$=Ionization voltage $X_m$=Emission coefficient

The influence of the gate-source voltage on the JFET can be taken into account by a factor, so that the complete characteristic curve for the isothermal JFET is as follows:

$$I_{JFET} = \left(1 - \frac{U_{GS}}{U_{on}}\right)^2 \cdot (I_d + I_{ion}) \qquad (3)$$

where $U_{on}$=Threshold voltage.

With $U_{GS}$=0, the component is in the turned-on state with contact resistance $R_{on}$, whereas with $U_{GS}$=$U_{on}$, the off-state with $I_{JFET}$=0 is generated.

Figure 1:
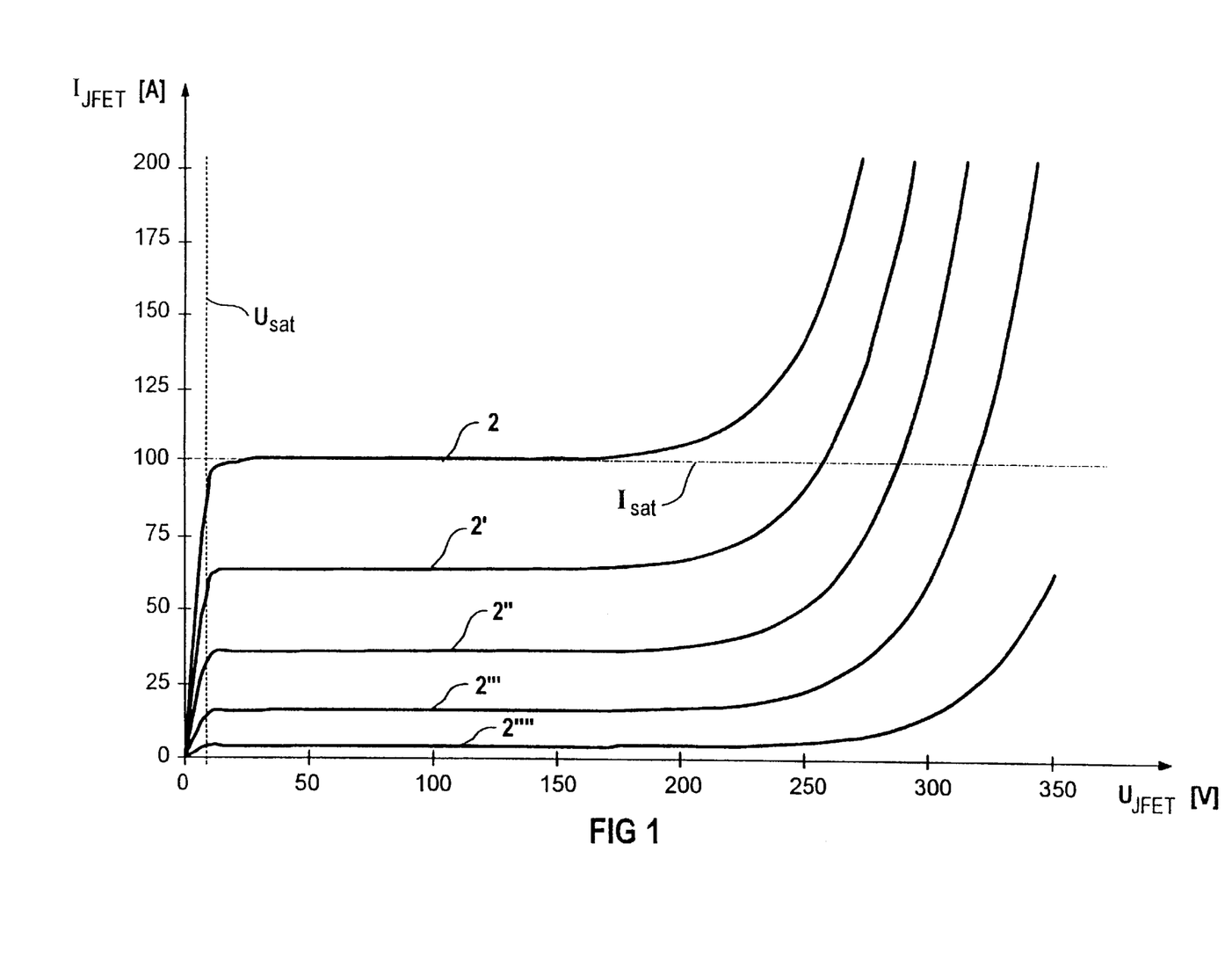
FIG. 1 is a graph illustrating a family of characteristic curves for a controlled JFET.

FIG. 1 shows the family of characteristic curves, resulting from equations (1) to (3), for a JFET 1, where $I_{JFET}$ is plotted as a function of $U_{JFET}$. The parameters chosen were $U_{on}$= 10V, $U_{sat}$=5V, $I_{sat}$=100 A ($R_{on}$=50 mOhm), β=2.5, $U_{ion}$= 50V, $I_{sat1}$=$10^{-6}$ A, $X_m$=35, with the gate-source voltage $U_{GS}$ having been changed from 0V in steps of –2V each, and the associated current $I_{JFET}$ in each case having been recorded as a function of the voltage $U_{JFET}$, the gate-source voltage and associated current being plotted as characteristic curves 2, 2', 2", ... The characteristic curves 2, 2', 2", ... each show a plateau as a function of $U_{GS}$. Above a voltage of approximately 300V, diode activation begins, although this can be avoided during JFET operation. For this reason, this effect is not taken into account in equations (1) to (3).

For a dynamic operation of the JFET, internal capacitances and resistances as well as a drift element would additionally have to be taken into account, however this is omitted in the present context.

In order to effect a disconnection or turning off after a short-circuit recognition, $U_{GS}$ cannot be changed abruptly from 0V to $U_{on}$, because in this case the JFET 1 would attempt to disconnect the circuit—which naturally contains inductances—immediately. In this case, the induction voltages arising in this instance would inevitably result in the JFET 1 and/or components of the circuitry 20, which is to be protected, being destroyed. Furthermore, the JFET 1 must be given a certain time after activation—specifically in the order of several microseconds—for effecting the depletion of charge carriers.

For the aforementioned reasons, the prior art reduces the gate-source voltage $U_{GS}$ from 0 V to $U_{on}$ with a ramp function. The basis for this procedure is the assumption that, after a short-circuit has occurred, the JFET first changes to its passive limitation with $I_{JFET}$=$I_{sat}$ and is only then turned off by the influence of $U_{GS}$. If, by contrast, the turn-off procedure actually occurs at much lower currents in the rated current range, as is the aim of early short-circuit recognition, then the conditions shown in FIGS. 2 and 3 arise. In this case, the time functions are denoted by 6 for $I_{JFET}$, by 7 for $U_{GS}$, by 8 for $U_{power\ supply}$ and by 9 for $U_{JFET}$.

Figure 2:
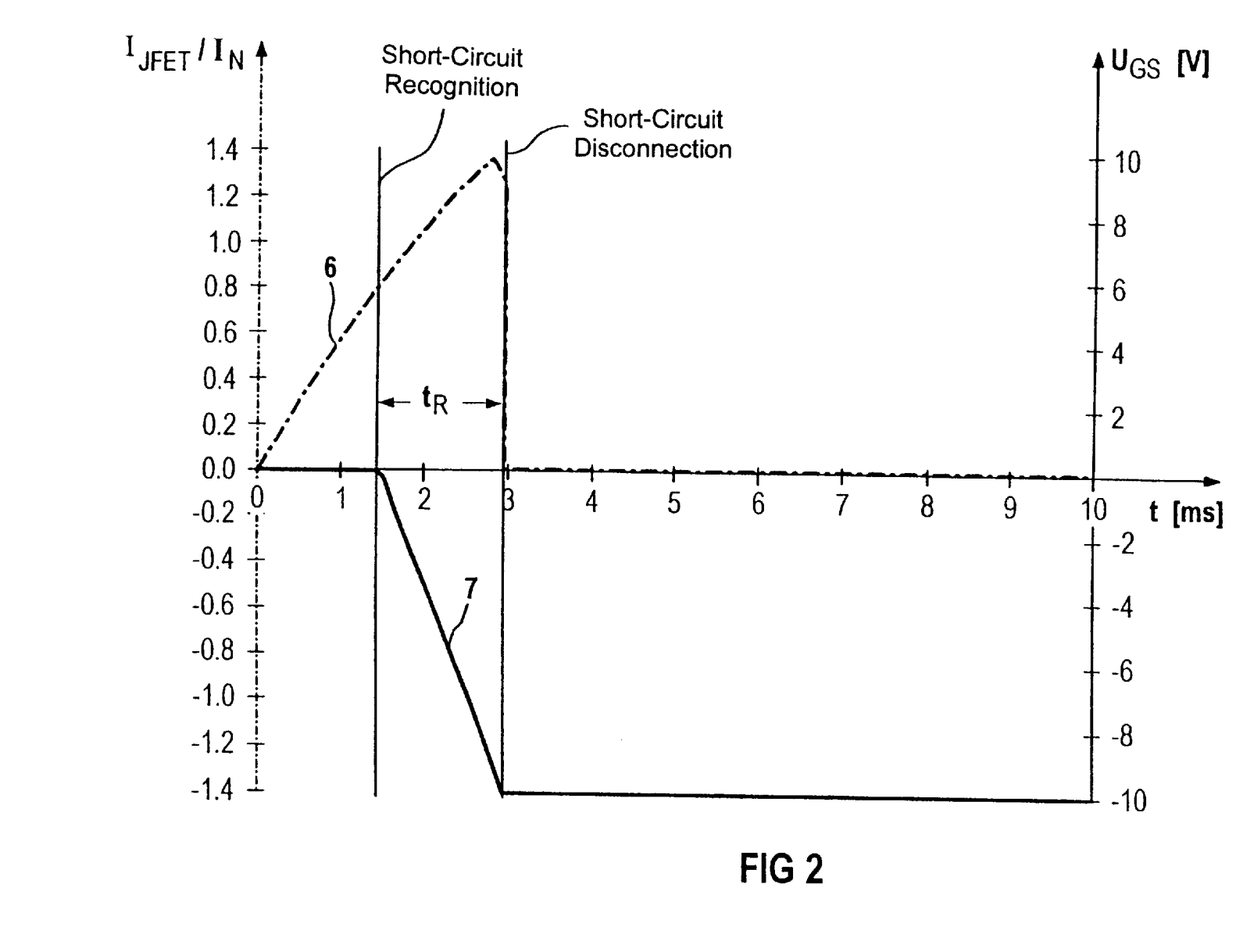
FIGS. 2 and 3 are graphs illustrating the temporal course of the normalized short-circuit current $I_{JFET}$ and of the gate-source voltage $U_{GS}$, on the one hand, and of the power supply voltage $U_{power\ supply}$ and of the JFET voltage $U_{JFET}$, on the other hand, when $U_{GS}$ is governed using a conventional procedure.
Figure 3:
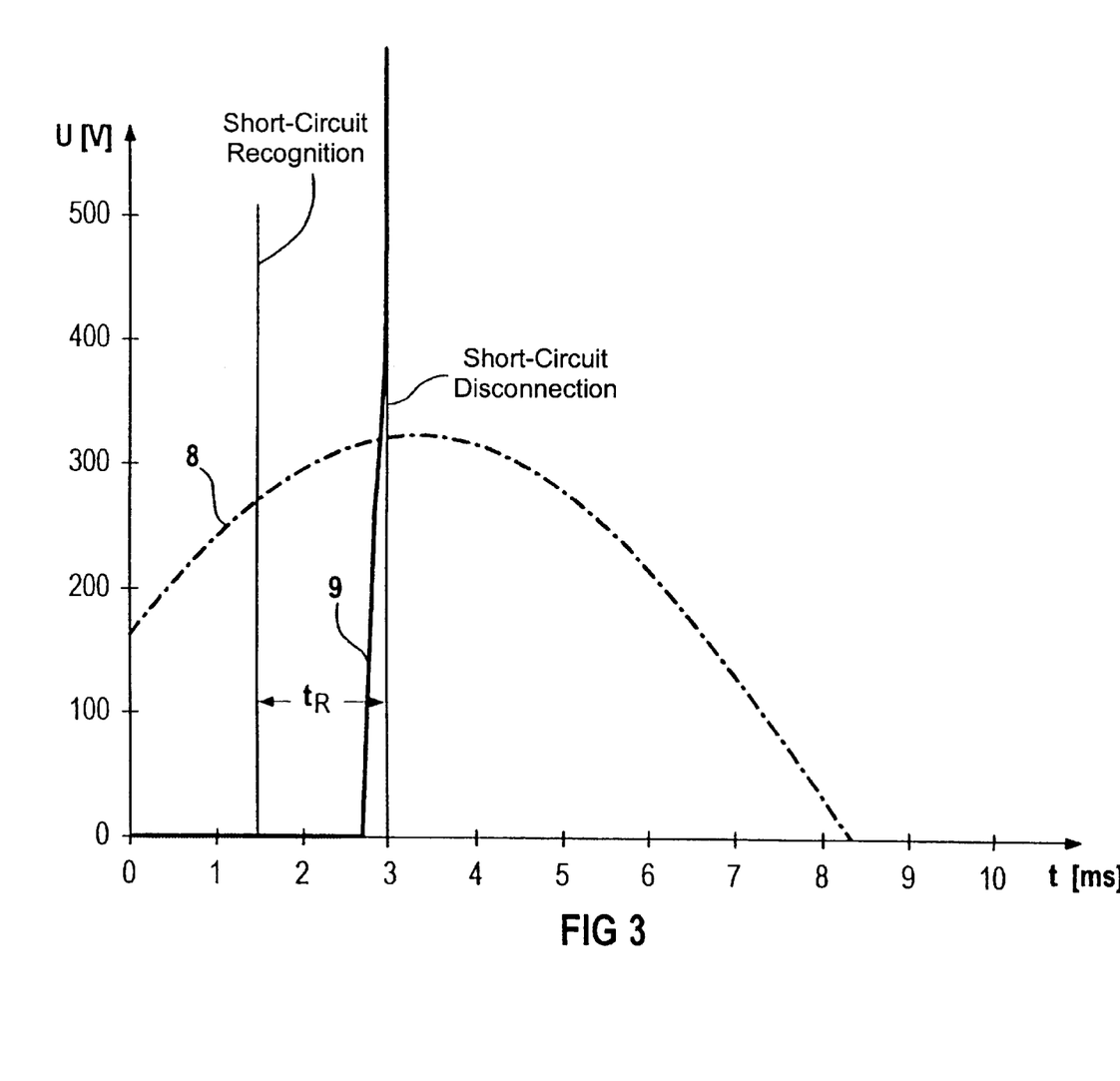

For the prerequisites forming the basis in FIGS. 1 to 3, the JFET 1 scarcely reacts at all in the range of $U_{GS}$=0 to 7 V and the short-circuit continues to exist virtually unaffected. This would result in a short-circuit disconnection being delayed unfavorably for the system connected downstream.

If the gate-source voltage $U_{GS}$ reaches the value $$U_{on} \cdot \left(1 - \sqrt{I_{JFET}(t)/I_{sat}}\right),$$

the voltage across the JFET 1 rises abruptly in order to produce additional ionization currents. As $U_{on}$ is approached further, the JFET 1 is finally inevitably turned off, although the short-circuit current has hardly been reduced up to this instant. This would result in high induction voltages which are very likely to be excessive for the JFET 1 and the short-circuit, and likewise result in a destruction.

To avoid the disadvantages outlined, $U_{GS}$ is now governed or adjusted, as a function of the JFET current, in such a way that the voltage $U_{JFET}$ on the one hand, immediately after charge carriers have been depleted, assumes the highest possible value which, on the other hand, is uncritical for the JFET and the circuitry.

In this case, the voltage is usually below the threshold for any diode activation which may be possible. These target functions and equations (1) to (3) produce the following regulating algorithm:

$$U_{GS} = U_{on}\left[1 - \sqrt{\frac{I_{JFET}(t)}{I_{SAT}\left(\frac{U_{JFET}^\beta}{U_{SAT}^\beta + U_{JFET}^\beta}\right)^{\frac{1}{\beta}} + I_{sat1} \cdot \sqrt{\frac{U_{JFET} - U_{ion}}{X_m \cdot U_{th}}} \cdot \exp\left(\sqrt{\frac{U_{JFET} - U_{ion}}{X_m \cdot U_{th}}}\right)}}\right] \qquad (4)$$

By combining the component-specific parameters and the desired voltage drop $U_{JFET}$ during short-circuit disconnection in a function $G_{JFET}$ which is dependent only on $U_{JFET}$, the following simplified rule is finally obtained:

$$U_{GS} = U_{on}\left[1 - \sqrt{\frac{I_{JFET}(t)}{G_{JFET}(U_{JFET})}}\right] \qquad (5)$$

According to equation (5), only the short-circuit current $I_{JFET}$ flowing through the JFET 1 need therefore be known to regulate the JFET 1. To prevent mismatches on account of aging drift and, in particular, temperature drift in the component parameters, the voltage $U_{JFET}$ is in some circumstances additionally evaluated in a subordinate control loop. A processor required for regulating purposes may thus be used to achieve the desired early short-circuit recognition and the short-circuit disconnection simultaneously.

FIG. 4 shows the resulting signal flow diagram. A processor 10 is provided for the JFET 1 with a first regulator unit 11, preferably having PI (proportional-integral) characteristics, and with a second unit 12 for generating a reference variable with the regulation algorithm specified in equation (5). In the associated short-circuit circuitry 20 for the current $I_K$, the inductor L is embodied by amplifiers 21, 21' having the gain 1/L and the ohmic resistor R is embodied by an amplifier 22 having the gain R and by an integrator 23 which integrates the current $I_K$ to take account of the inductances.

To ensure that the required charge carrier depletion is achieved, $U_{GS}$ is changed within a few μs to a value which generates the appropriate JFET voltage immediately after recognition of the short-circuit. According to present findings, JFET voltages in a range from 250 to 350V are realistic in this case, i.e. during short-circuit disconnection.

Figure 5:
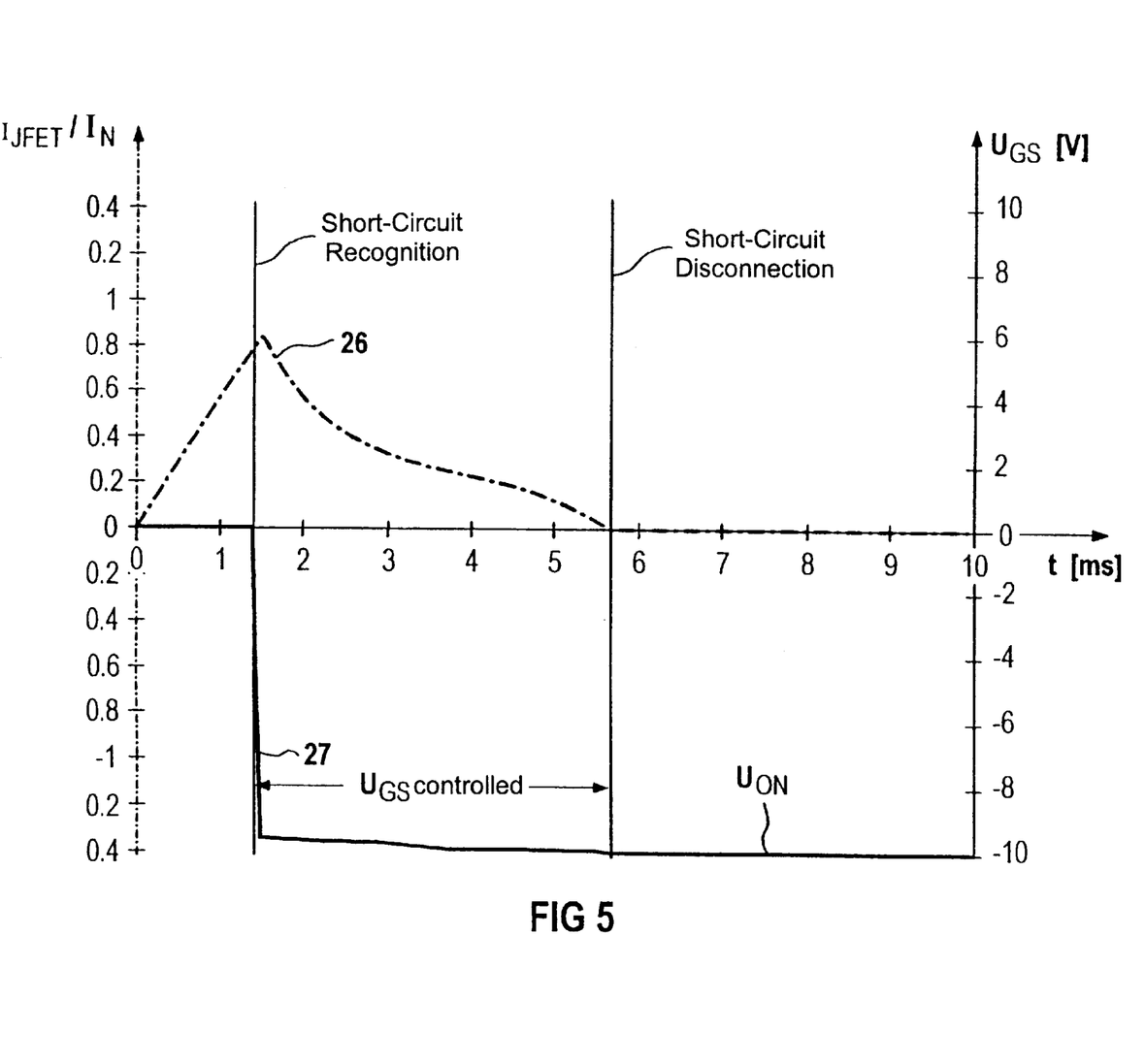
FIGS. 5 and 6 are graphs illustrating the temporal course of the short-circuit current $I_{JFET}$ and of the gate-source voltage $U_{GS}$, on the one hand, and of the JFET voltage and of the power supply voltage $U_{power\ supply}$, on the other hand, corresponding to FIGS. 2 and 3 when the procedure according to the invention is used.
Figure 6:
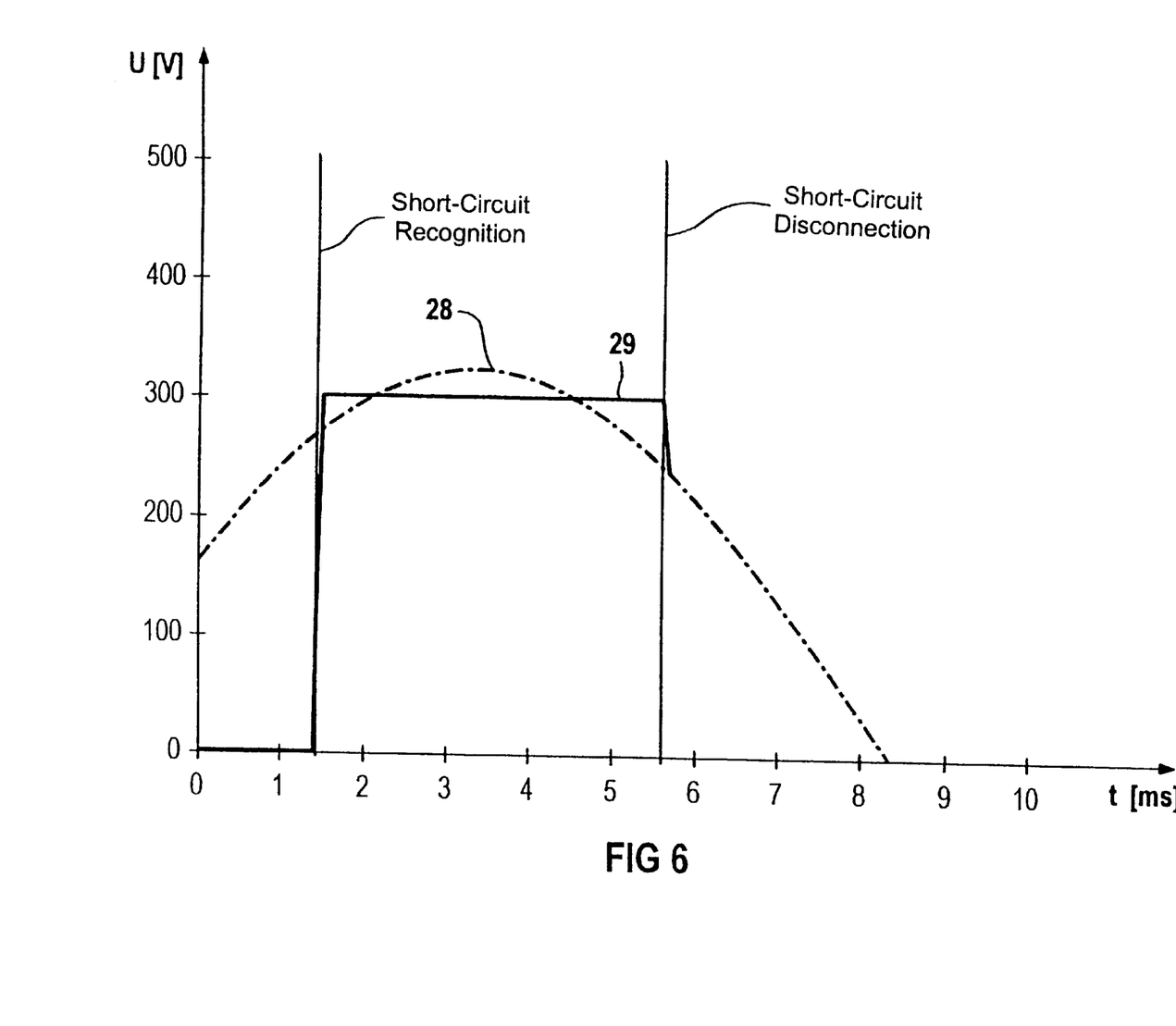

A switching procedure comparable with that in FIGS. 2 and 3, using the novel $U_{GS}$ control, is shown in FIGS. 5 and 6. In this case, corresponding time functions are denoted, as in FIGS. 2 and 3, by 26 for $I_{JFET}$, by 27 for $U_{GS}$, by 28 for $U_{power\ supply}$ and by 29 for $U_{JFET}$. It can be seen that the voltage $U_{GS}$ is changed according to a ramp in the microsecond range immediately after the short-circuit has been recognized, for the purpose of charge carrier depletion. This is followed by the regulated range for $U_{GS}$ up until the short-circuit disconnection.

FIGS. 5 and 6 show a course for the short-circuit current and for the voltage $U_{GS}$ such that, in the case of a prospective short-circuit current equivalent to 1.2 times the rated current ($\eta_K$=1.2), a power factor for the short-circuit loop of 0.9 ($\cos\phi$=0.9), and a short-circuit occurrence angle, with respect to the power supply voltage, of 30° ($\psi$=30°), a voltage drop $U_{JFET}$ of approximately 300V is produced across the JFET 1. Additional voltage spikes do not occur in this instance.

Overall, the method described above with the associated apparatus results in significant advantages: in a fault situation, short-circuit current disconnection starts immediately and the thermal and dynamic loading of the circuitry and of the whole system are thus reduced. Due to a self-protection, it is not possible for the JFET to be destroyed in the apparatus. Since high current pulses at the gate of the JFET are avoided, the entire system is saved from overvoltages, so that the external protection demanded is assured.

We claim:

1. A method for performing a short-circuit and overload disconnection with a semiconductor component, the method which comprises:

providing a semiconductor component having a drain, a source and a gate, the semiconductor component having a gate-source voltage $U_{GS}$ applied thereto, having a current $I_{JFET}$ flowing therethrough, and having a voltage $U_{JFET}$ dropping across the semiconductor component;

adjusting, in an operating situation, the gate-source voltage $U_{GS}$ at the semiconductor component, in dependence on the current $I_{JFET}$, such that, after charge carriers in the semiconductor component are depleted, the voltage $U_{JFET}$ assuming the highest possible value still uncritical for the semiconductor component and for a circuit to be disconnected; and using, for the step of adjusting the gate-source voltage $U_{GS}$, an algorithm in the form of $$U_{GS} = U_{on}\left[1 - \sqrt{\frac{I_{JFET}(t)}{G_{JFET}(U_{JFET})}}\right]$$

where $U_{on}$ denotes a switching voltage, $I_{JFET}(t)$ denotes the current $I_{JFET}$ in dependence on a time t, and $G_{JFET}$ denotes a function dependent only on the voltage $U_{JFET}$ dropping across the semiconductor component.

2. The method according to claim 1, which comprises using, as the semiconductor component, an active limiter in the form of a JFET based on silicon carbide.

3. The method according to claim 1, which comprises using the current $I_{JFET}$ for at least one of an open-loop control and a closed-loop control of the semiconductor component.

4. The method according to claim 1, which comprises:

recording the voltage $U_{JFET}$ as an actual value at the semiconductor component;

using the actual value for determining a closed-loop control signal; and compensating, with the closed-loop control signal, a parameter drift of the semiconductor component.

5. The method according to claim 1, which comprises:

determining open-loop control signals and closed-loop control signals from at least one of the current $I_{JFET}$ and the voltage $U_{JFET}$; and superimposing the open-loop control signals and the closed-loop control signals for controlling the semiconductor component.

6. In combination with a short-circuit and overload circuitry and a semiconductor component connected to the short-circuit and overload circuitry, the semiconductor component having a drain, a source and a gate, the semiconductor component having a gate-source voltage $U_{GS}$ applied thereto, a current $I_{JFET}$ flowing therethrough, and a voltage $U_{JFET}$ dropping between the drain and the source, an apparatus for performing a short-circuit and overload disconnection, comprising:

a processor operatively connected to the semiconductor component for processing measured values and for early recognition of one of a short-circuit and an overload;

said processor being programmed to:

adjust, in an operating situation, the gate-source voltage $U_{GS}$ at the semiconductor component, in dependence on the current $I_{JFET}$, such that, after a charge carrier depletion in the semiconductor component, the voltage $U_{JFET}$ assuming the highest possible value still uncritical for the semiconductor component and for the short-circuit and overload circuitry to be disconnected;

use an algorithm in the form of $$U_{GS} = U_{on}\left[1 - \sqrt{\frac{I_{JFET}(t)}{G_{JFET}(U_{JFET})}}\right]$$

for adjusting the gate-source voltage $U_{GS}$, where $U_{on}$ denotes a switching voltage, $I_{JFET}(t)$ denotes the current $I_{JFET}$ in dependence on a time t, and $G_{JFET}$ denotes a function dependent only on the voltage $U_{JFET}$ dropping between the drain and the source; and drive the semiconductor component as an active limiter for supervising the short-circuit and overload circuitry.

7. The apparatus according to claim 6, wherein said processor is configured to carry out a regulating function.

8. The apparatus according to claim 6, wherein said processor is configured to carry out a PI regulating function.

9. The apparatus according to claim 6, wherein said processor is configured to carry out an open-loop control function based on the algorithm for driving the semiconductor component.

10. The apparatus according to claim 6, wherein said processor is configured to carry out a closed-loop control function based on the algorithm for controlling the semiconductor component.

11. The apparatus according to claim 6, wherein:

said processor includes a first unit for producing a regulating signal and a second unit for producing a reference variable with the algorithm; and said processor forms a summation signal from the regulating signal and the reference variable for driving the semiconductor component as an active limiter.

12. An apparatus for performing a short-circuit and overload disconnection, comprising:

a semiconductor component being an active limiter for supervising a short-circuit and overload circuitry, said semiconductor component having a drain, a source and a gate, said semiconductor component having a gate-source voltage $U_{GS}$ applied thereto, a current $I_{JFET}$ flowing therethrough, and a voltage $U_{JFET}$ dropping between the drain and the source; and a processor operatively connected to said semiconductor component for processing measured values and for early recognition of one of a short-circuit and an overload;

said processor being programmed to:

adjust, in an operating situation, the gate-source voltage $U_{GS}$ at said semiconductor component, in dependence on the current $I_{JFET}$, such that, after a charge carrier depletion in said semiconductor component, the voltage $U_{JFET}$ assuming the highest possible value still uncritical for the semiconductor component and for the short-circuit and overload circuitry to be disconnected; and use an algorithm in the form of $$U_{GS} = U_{on}\left[1 - \sqrt{\frac{I_{JFET}(t)}{G_{JFET}(U_{JFET})}}\right]$$

for adjusting the gate-source voltage $U_{GS}$, where $U_{on}$ denotes a switching voltage, $I_{JFET}(t)$ denotes the current $I_{JFET}$ in dependence on a time t, and $G_{JFET}$ denotes a function dependent only on the voltage $U_{JFET}$ dropping between the drain and the source.

13. The apparatus according to claim 12, wherein said processor is configured to carry out a regulating function.

14. The apparatus according to claim 12, wherein said processor is configured to carry out a PI regulating function.

15. The apparatus according to claim 12, wherein said processor is configured to carry out an open-loop control function based on the algorithm for driving the semiconductor component.

16. The apparatus according to claim 12, wherein said processor is configured to carry out a closed-loop control function based on the algorithm for controlling the semiconductor component.

17. The apparatus according to claim 12, wherein:

said processor includes a first unit for producing a regulating signal and a second unit for producing a reference variable with the algorithm; and said processor forms a summation signal from the regulating signal and the reference variable for driving the semiconductor component as an active limiter.

* * * * *